(12) United States Patent
Souriau et al.

(10) Patent No.: US 9,768,518 B2
(45) Date of Patent: Sep. 19, 2017

(54) MICROELECTRONIC WIRELESS TRANSMISSION DEVICE

(71) Applicant: COMMISSARIAT A L'ENERGIE ATOMIQUE ET AUX ENE ALT, Paris (FR)

(72) Inventors: Jean-Charles Souriau, Saint Egreve (FR); Leaticia Castagne, Fontaine (FR); Guy-Michel Parat, Claix (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 540 days.

(21) Appl. No.: 13/868,295

(22) Filed: Apr. 23, 2013

(65) Prior Publication Data

US 2013/0293428 A1 Nov. 7, 2013

(30) Foreign Application Priority Data

May 3, 2012 (FR) ..................... 12 54080

(51) Int. Cl.
*H01Q 1/52* (2006.01)
*H01Q 19/10* (2006.01)
(Continued)

(52) U.S. Cl.
CPC ............ *H01Q 19/10* (2013.01); *H01L 22/10* (2013.01); *H01L 23/552* (2013.01); *H01L 23/58* (2013.01);
(Continued)

(58) Field of Classification Search
CPC ........... H01Q 19/10; H01Q 1/38; H01Q 1/526
(Continued)

(56) References Cited

U.S. PATENT DOCUMENTS 6,037,879 A * 3/2000 Tuttle ............... G06K 19/07749
340/10.1
6,198,392 B1 3/2001 Hahn et al.
(Continued)

FOREIGN PATENT DOCUMENTS

EP 1 804 075 A2 7/2007
JP 2005346521 A * 12/2005

OTHER PUBLICATIONS

N. Hoivik, et al., "High-Efficiency 60 $GH_z$ Antenna Fabricated Using Low-Cost Solicon Micromachining Techniques" IEEE International Symposium on Antennas and Propagation Society, Jun. 9-15, 2007, pp. 5043-5046.
(Continued)

*Primary Examiner* — Dieu H Duong
(74) *Attorney, Agent, or Firm* — Oblon, McClelland, Maier & Neustadt, L.L.P.

(57) ABSTRACT

A microelectronic wireless transmission device including:
a substrate able to be traversed by radio waves intended to be emitted by the device,
an antenna,
an electrical power supply,
an integrated circuit, electrically connected to the antenna and to the electrical power supply, and able to transmit to the antenna electrical signals intended to be emitted by the antenna in the form of the said radio waves,
a cap rigidly connected to the substrate and forming, with the substrate, at least one cavity in which the antenna and the integrated circuit are positioned, where the cap comprises an electrically conductive material connected electrically to an electrical potential of the electrical power supply and/or of the integrated circuit, and able to form a reflector with regard to the radio waves intended to be emitted by the antenna.

18 Claims, 4 Drawing Sheets

Figure 1:
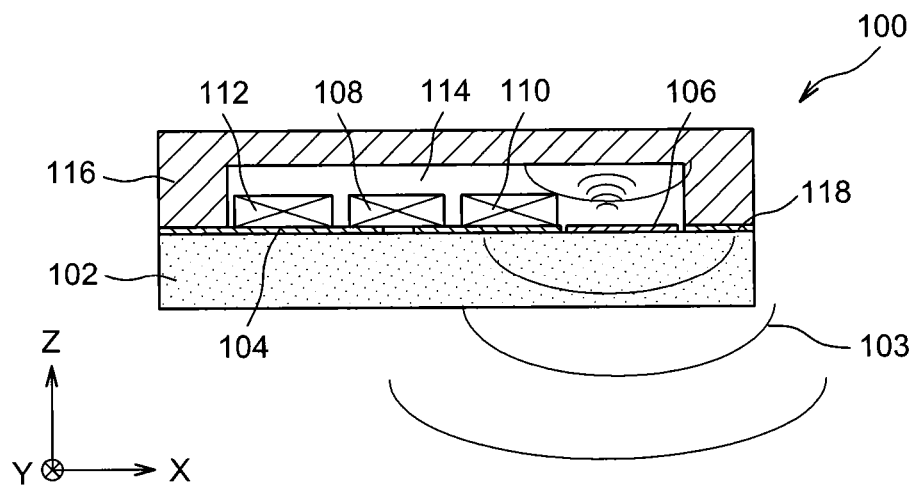

(51) Int. Cl.
| | |
|---|---|
| *H01L 23/66* | (2006.01) |
| *H01L 21/66* | (2006.01) |
| *H01L 23/552* | (2006.01) |
| *H01L 23/58* | (2006.01) |
| *H01L 25/16* | (2006.01) |
| *H01Q 1/38* | (2006.01) |
| *H04B 1/3888* | (2015.01) |
| *G06K 19/077* | (2006.01) |
| *H01L 23/10* | (2006.01) |
| *H01L 21/50* | (2006.01) |
| *H01L 23/00* | (2006.01) |

(52) U.S. Cl.
CPC ............ H01L 23/66 (2013.01); H01L 25/165 (2013.01); H01Q 1/38 (2013.01); *G06K 19/07786* (2013.01); *H01L 21/50* (2013.01); *H01L 23/10* (2013.01); *H01L 24/13* (2013.01); *H01L 24/16* (2013.01); *H01L 24/48* (2013.01); *H01L 24/81* (2013.01); *H01L 24/85* (2013.01); *H01L 2223/6677* (2013.01); *H01L 2224/13109* (2013.01); *H01L 2224/13111* (2013.01); *H01L 2224/16225* (2013.01); *H01L 2224/48137* (2013.01); *H01L 2224/48227* (2013.01); *H01L 2224/81424* (2013.01); *H01L 2224/81444* (2013.01); *H01L 2224/81447* (2013.01); *H01L 2224/81455* (2013.01); *H01L 2224/81466* (2013.01); *H01L 2224/81484* (2013.01); *H01L 2224/85424* (2013.01); *H01L 2224/85444* (2013.01); *H01L 2224/85447* (2013.01); *H01L 2224/85455* (2013.01); *H01L 2224/85466* (2013.01); *H01L 2224/85484* (2013.01); *H01L 2924/00014* (2013.01); *H01L 2924/14* (2013.01); *H01L 2924/1433* (2013.01); *H01L 2924/1461* (2013.01); *H01L 2924/157* (2013.01); *H01L 2924/1579* (2013.01); *H01L 2924/15192* (2013.01); *H01L 2924/15788* (2013.01); *H01L 2924/165* (2013.01); *H01L 2924/167* (2013.01); *H01L 2924/16152* (2013.01); *H01L 2924/16153* (2013.01); *H01L 2924/16251* (2013.01); *H01L 2924/16586* (2013.01); *H04B 1/3888* (2013.01)

(58) Field of Classification Search
USPC .................................. 343/841, 700 MS, 702
See application file for complete search history.

(56) References Cited

U.S. PATENT DOCUMENTS

| | | | | |
|---|---|---|---|---|
| 6,236,366 | B1* | 5/2001 | Yamamoto ............ | H01L 25/165 331/48 |
| 6,518,932 | B1* | 2/2003 | Matsui ..................... | H01Q 1/42 343/700 MS |
| 6,720,866 | B1* | 4/2004 | Sorrells .............. | G06K 19/0717 340/10.34 |
| 7,999,727 | B2* | 8/2011 | Cooke ..................... | G01S 7/032 342/175 |
| 2002/0075184 | A1* | 6/2002 | Tuttle ................... | G06K 7/0008 343/700 MS |
| 2007/0103311 | A1* | 5/2007 | Kippelen ........... | G06K 19/0723 340/572.8 |
| 2008/0308912 | A1* | 12/2008 | Cha ........................ | H01L 23/29 257/659 |
| 2009/0146874 | A1* | 6/2009 | Tsai ........................ | G01S 19/09 342/357.75 |
| 2010/0193935 | A1 | 8/2010 | Lachner et al. | |
| 2013/0296658 | A1 | 11/2013 | Souriau et al. | |

OTHER PUBLICATIONS

Alain Levasseur, et al., "Microbatteries—Microsources d'energie en couches minces", Dossier Techniques De L'Ingénieur, 2009, 15 pages.

Amin Enayati, et al., "Antenna-in-Package Solution for 3D Integration of Millimeter-Wave Systems Using a Thin-Film MCM Technology", Microwave Symposium Digest (MTT), 2011, 4 pages.

Brian Gaucher, "Advanced Millimeter-Wave Technologies: Antennas, Packaging and Circuits", John Wiley & Sons, Chapter 1-Introduction, Mar. 2009, pp. 1-14.

French Preliminary Search Report issued Feb. 11, 2013, in French 1254080, filed May 3, 2012 (with English Translation of Categories of Cited Documents).

U.S. Appl. No. 14/510,525, filed Oct. 9, 2014, Lamy, et al.

* cited by examiner

MICROELECTRONIC WIRELESS TRANSMISSION DEVICE

TECHNICAL FIELD

The invention relates to a microelectronic wireless transmission device, operating autonomously. Such a device is advantageously fitted with a sensor in order to form an autonomous detection structure, able to transmit measurement results by radio waves. The invention also relates to a method for producing such a microelectronic wireless transmission device.

STATE OF THE PRIOR ART

It is known to produce microelectronic measuring devices of the wireless transmitter type. Such wireless microsensors, which are therefore autonomous, are produced in the form of small-size components, each of which includes a sensor, a microprocessor, an energy source and a data transmission system. Their function is to measure one or more physical parameters (temperature, pressure, vibration, $CO_2$, etc.), to convert these measurements into quantifiable values, and to transmit them by radio waves for processing. One advantage of these microsensors is that it is possible to disperse a large number of them without having to provide maintenance for them.

A proportion of the microsensor's elements are produced, for example, on a ceramic of the HTTC or LTTC type, or on a printed circuit, and then encapsulated in a polymer. These technologies are, however, complex and expensive to implement. In addition, the miniaturisation and pattern resolution which may be obtained with such microsensors are limited. And the performance characteristics of these devices at the envisaged transmission frequencies, which are between several tens of MHz and several tens of GHz, are very sensitive to the geometric factors of the devices. In addition, the thermal expansion difference between the support (ceramic or printed circuit) and the silicon electronic components may lead to failures of such microsensors over time.

The document "High-efficiency 60 GHz antenna fabricated using low-cost silicon micromachining techniques" by N. Hoivik et al., Antennas and Propagation Society International Symposium, 2007 IEEE, Honolulu, Hi., 9-15 Jun. 2007, pages 5043-5046, describes a microelectronic wireless transmitter device in which an integrated circuit and an antenna are produced on a silicon support. These elements are packaged by a silicon cap transferred on to the silicon support, in which a reflective cavity is formed, intended to be positioned opposite the antenna, and the back wall of which is covered with several metal layers.

Compared to devices including a ceramic support or a printed circuit, use of a silicon support enables the achievable miniaturisation to be improved, and therefore the performance characteristics of the device. Conversely, the solution presented in this document requires that a metallic conformal deposit is produced throughout the cap, which is a delicate step to implement, and which implies risks of dropouts in the metallic layer deposited in this manner.

DESCRIPTION OF THE INVENTION

Thus there is a need to propose a new type of microelectronic wireless transmission device which does not have the disadvantages of the devices of the prior art, i.e. which does not have the disadvantages relating to the use of a ceramic support or a printed circuit, and which does not require the use of metallic conformal deposits.

To accomplish this, one embodiment proposes a microelectronic wireless transmission device including at least:
  a substrate able to be traversed by radio waves intended to be emitted by the microelectronic device,
  an antenna,
  an electrical power supply,
  an integrated circuit, electrically connected to the antenna and to the electrical power supply, and able to transmit to the antenna electrical signals intended to be emitted by the antenna in the form of the said radio waves,
  a cap rigidly connected to the substrate and forming, with the substrate, at least one cavity in which the antenna and the integrated circuit are positioned, where the cap comprises an electrically conductive material connected electrically to an electrical potential of the electrical power supply and/or of the integrated circuit, and able to form a reflector with regard to the radio waves intended to be emitted by the antenna.

Integration of an autonomous miniature system is thus proposed, where this system is able to communicate with the external environment by radiofrequencies and including an integrated circuit, for example an ASIC (Application-Specific Integrated Circuit) electrically connected to a power source and an antenna, and a cap the functions of which are to protect the elements, or components, positioned in the cavity, and to form a radio wave reflector. The cap comprises one or more electrically conductive materials and is connected to an electrical potential of the electrical power supply and/or of the integrated circuit, in order to perform the function of wave reflector.

The cap's electrically conductive material is advantageously highly doped silicon (for example of approximately 1 mOhm·cm to several tens of mOhm·cm, or between approximately 1 and 100 mOhm·cm).

The microelectronic device may be of millimetric dimensions, and the device's communication frequencies band may be around 60 GHz.

The integrated circuit and the antenna may be positioned in two separated cavities formed between the cap and the substrate. Such a configuration can be advantageous in preventing the integrated circuit from disturbing the antenna, or in preventing the integrated circuit from being disturbed by the antenna. In this case, electrical connections between the integrated circuit and the antenna may pass from one cavity to the other.

As a variant, the integrated circuit and the antenna may alternatively be positioned in two portions of the same cavity which are separated from one another by an electromagnetic screen, where such a screen enables electromagnetic disturbances between the integrated circuit and the antenna to be prevented. In this case, electrical connections between the integrated circuit and the antenna may pass under the electromagnetic screen.

The substrate able to be traversed by radio waves may comprise one or more materials able to be traversed by the said radio waves, such as for example non-doped silicon, $SiO_2$, or polymer. As a variant, it is possible for a portion only of the substrate to comprise one or more materials able to be traversed by the radio waves. This portion of the substrate forms a "window" through which the radio waves can be emitted.

The electrical power supply may include at least one microbattery and/or may be positioned in the cavity or one of the cavities.

The electrical connections between the integrated circuit and the antenna, between the integrated circuit and the electrical power supply, and between the cap and the electrical power supply, may include wires and/or electrically conductive tracks positioned on the substrate.

The electrically conductive tracks may comprise at least one electrically conductive material, advantageously a metallic material, similar to at least one electrically conductive material of the antenna. The electrically conductive tracks can thus be produced from one or more metal layers which are also used to produce the antenna.

The side walls of the cavity may be formed by the cap.

The cap may be rigidly connected to the substrate by at least one sealing bead comprising at least one electrically conductive material.

In this case the electrical power supply and/or the integrated circuit may be electrically connected to the sealing bead which is in contact with the cap. The cap may thus be electrically connected to an electrical potential of the electrical power supply and/or of the integrated circuit via the sealing bead.

The sealing bead may comprise at least one metal material similar to at least one metal material of the antenna. The sealing bead may thus be produced from one or more metal layers which are also used to produce the antenna.

The device may also include at least one sensor positioned in the cavity, or one of the cavities, and electrically connected to the integrated circuit, such that the sensor is able to transmit at least one measuring signal to the integrated circuit, where at least one portion of the electrical signals transmitted by the integrated circuit to the antenna may depend on the measuring signal transmitted to the integrated circuit by the sensor. In such a configuration, in which the sensor is encapsulated in the cavity, the target applications may be those in which physical measurements are made without direct contact with the exterior, for example measurement of a vibration or of radiation. Such a microelectronic device may meet needs in the fields of industry, transport, housing and security, for example to anticipate the failure of mechanical parts by monitoring the vibrations. Such a device may also be a medical device allowing cardiac activity to be monitored (for example, positioned at the end of a cardiac stimulation probe).

Such a device may also include at least one energy recovery device electrically coupled to the electrical power supply.

Another embodiment proposes a method for producing a microelectronic wireless transmission device, including at least the following steps:

integration, on a substrate able to be traversed by radio waves intended to be emitted by the microelectronic device, of an antenna, an electrical power supply and an integrated circuit electrically connected to the antenna and to the electrical power supply, and able to transmit to the antenna electrical signals intended to be emitted by the antenna in the form of the said radio waves, rigid connection of a cap to the substrate, forming at least one cavity in which the antenna and the integrated circuit are positioned, where the cap comprises an electrically conductive material connected electrically to an electrical potential of the electrical power supply and/or of the integrated circuit, and able to form a reflector with regard to the radio waves intended to be emitted by the antenna.

The term "integration" in this case refers to the production by transfer and/or by formation of the said abovementioned elements on the substrate.

The method may include at least, before the electrical power supply and the integrated circuit are integrated, steps of deposition, photolithography and etching of at least one electrically conductive layer on the substrate, forming the antenna and electrically conductive tracks, where the integrated circuit and the electrical power supply may be connected to at least one portion of the electrically conductive tracks by microbeads (for example comprising fusible material), or wired connections, where the electrically conductive tracks form at least a proportion of the electrical connections between the integrated circuit and the antenna, between the integrated circuit and the electrical power supply, and between the cap and the electrical power supply and/or the integrated circuit.

The steps of deposition, photolithography and etching of the said at least one electrically conductive layer on the substrate may also form at least a portion of a sealing bead, where the cap is rigidly connected to the substrate by the sealing bead.

The method may also include integration (i.e. production by transfer and/or by formation on the substrate) of a sensor, such that it is positioned in the cavity and electrically connected to the integrated circuit, where the sensor is able to transmit at least one measuring signal to the integrated circuit, where at least a proportion of the electrical signals transmitted by the integrated circuit to the antenna depends on the measuring signal transmitted to the integrated circuit by the sensor.

The method may also include at least integration (i.e. production by transfer and/or by formation on the substrate) of an energy recovery device electrically coupled to the power supply.

BRIEF DESCRIPTION OF THE ILLUSTRATIONS

Figure 2A:
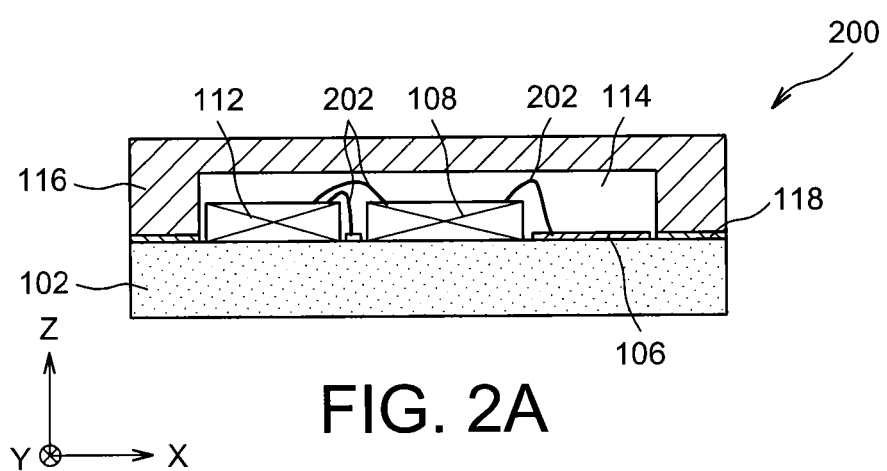
Figure 2B:
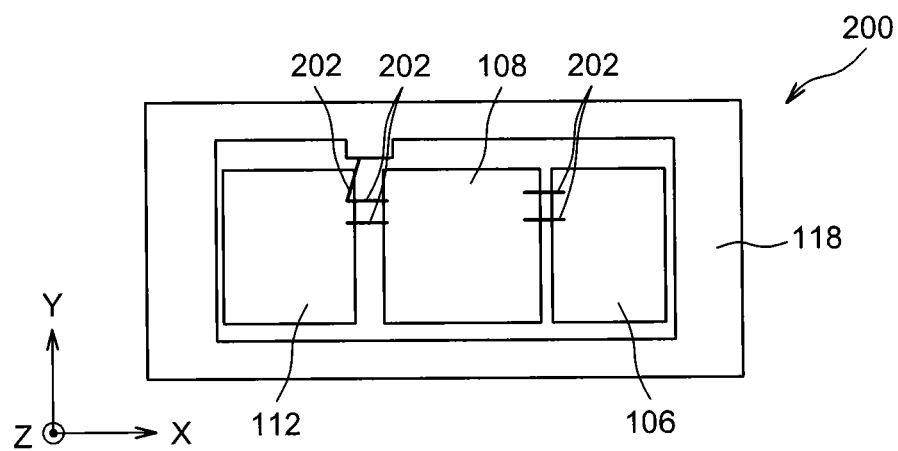
Figure 3:
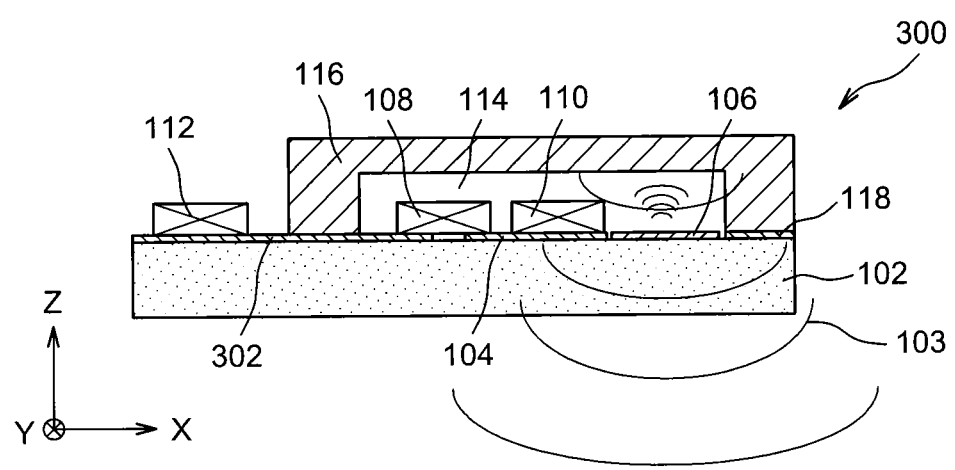
Figure 4A:
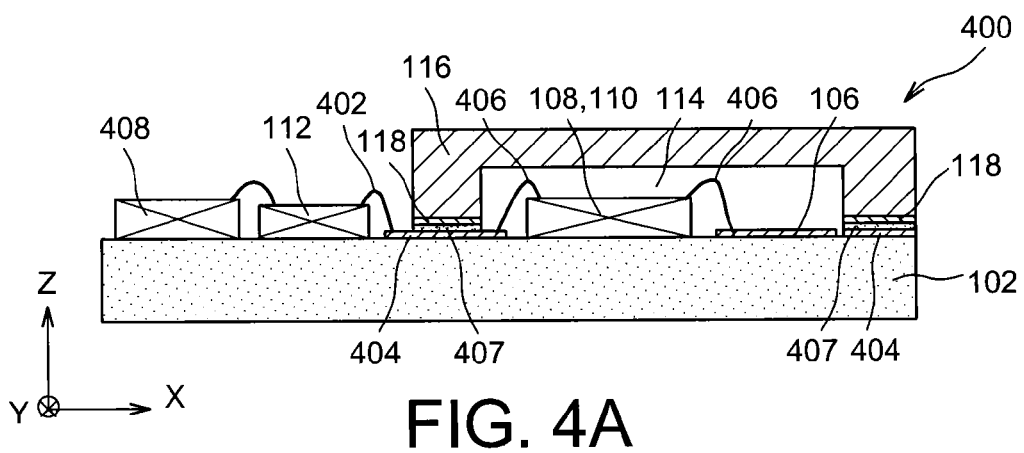
Figure 4B:
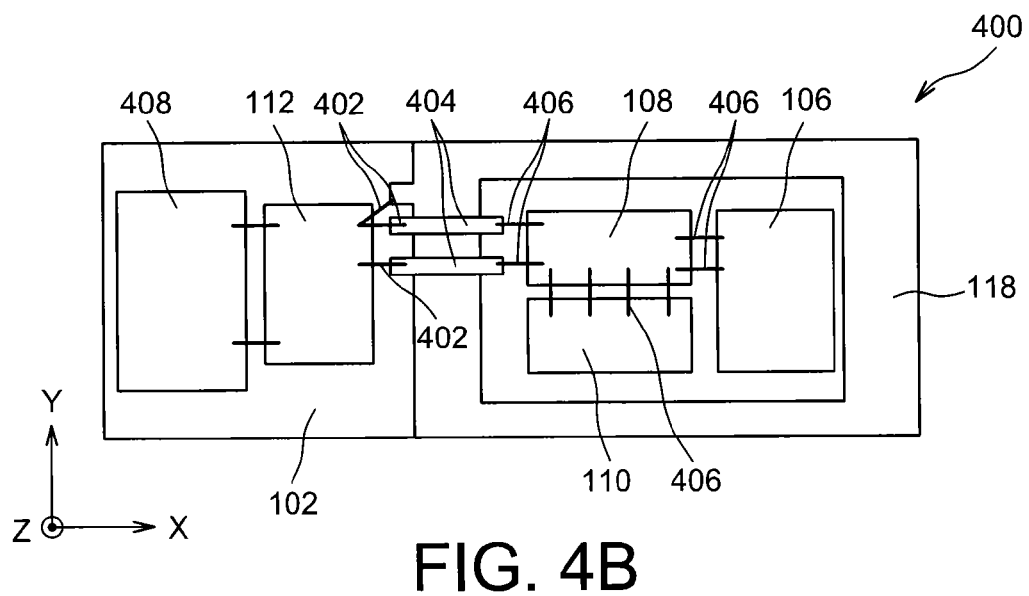
Figure 5A:
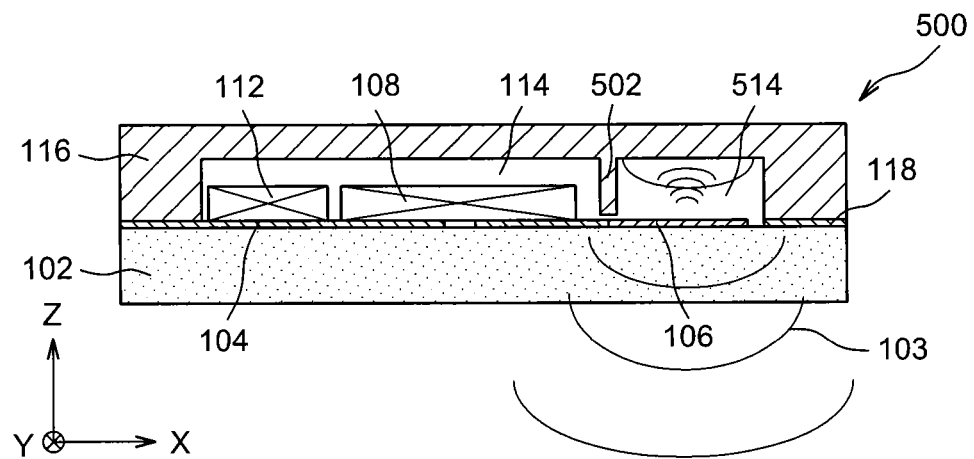
Figure 5B:
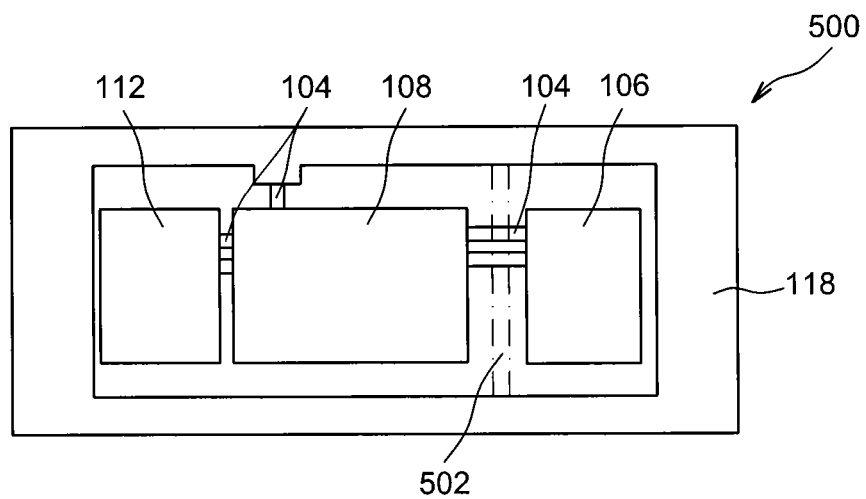

The present invention will be better understood on reading the description of example embodiments given purely as an indication and in no sense restrictively, making reference to the appended illustrations in which:

FIG. 1 represents a profile section view of a microelectronic wireless transmission device according to a first embodiment, FIGS. 2A and 2B represent profile and top section views of a microelectronic wireless transmission device according to a second embodiment, FIG. 3 represents a profile section view of a microelectronic wireless transmission device according to a third embodiment, FIGS. 4A and 4B represent profile and top section views of a microelectronic wireless transmission device according to a fourth embodiment, FIGS. 5A and 5B represent profile and top section views of a microelectronic wireless transmission device according to a fifth embodiment.

Identical, similar or equivalent parts of the various figures described below have the same numerical references, to make it easier to move from one figure to another.

The various parts represented in the figures are not necessarily represented at a uniform scale, in order to make the figures more readable.

The various possibilities (variants and embodiments) must be understood as not being mutually exclusive, and being able to be combined with one another.

DETAILED DESCRIPTION OF PARTICULAR EMBODIMENTS

Reference is firstly made to FIG. 1, which represents a profile section view of a microelectronic wireless transmission device 100, according to a first embodiment.

Device 100 includes a substrate 102 on which various components, or elements, of device 100 are produced, or integrated. The material or materials of substrate 102 are in this case chosen such that the radio waves (represented symbolically in FIG. 1 and bearing reference 103) intended to be emitted by device 100 are able to traverse, or cross, substrate 102. In this first embodiment, substrate 102 comprises silicon and/or glass and/or polymer. The thickness (dimension in the Z axis) of substrate 102 is, for example, between approximately 50 µm and 500 µm. The length (dimension in the X axis) of substrate 102, which may be equal to the total length of device 100, and/or the width (dimension in the Y axis) of substrate 102, which may be equal to the total width of device 100, are for example between approximately 0.5 mm and 20 mm.

Several electrically conductive tracks 104, comprising for example one or more metals, are produced on the front face of substrate 102, on which are positioned the various components of device 100. These electrically conductive tracks 104 in particular enable the components of device 100 to be electrically connected to one another. Electrically conductive tracks 104 are produced from one or more metal layers deposited on substrate 102, for example by electrolytic means, by plasma deposition (for example of the PECVD type, i.e. a Plasma Enhanced Chemical Vapour Deposition), or by evaporation. This or these metal layers are then subject to one or more steps of photolithography and of wet and/or dry etching, depending on the desired pattern. These metal layers comprise, for example, titanium, and/or tungsten nitride and/or nickel and/or aluminium and/or copper and/or gold. Electrically conductive tracks 104 are for example between approximately 100 nm and 5 µm thick. Finally, tracks 104 are separated, in order to be electrically insulated from one another. Tracks 104 are also advantageously deposited on a layer of dielectric material, for example an oxide such as $SiO_2$ and/or a polymer, positioned on the front face of substrate 102 when the latter is electrically conductive. In addition, tracks 104 may be covered by an electrically insulating layer, for example comprising a silicon oxide or a polymer.

The pattern of the metal layer or layers deposited on substrate 102 and etched includes advantageously, in addition to electrically conductive tracks 104, a portion able to form an antenna 106 of device 100 able to emit and possibly receive radio waves. The area occupied by antenna 106 on substrate 102 depends in particular on the frequency or frequencies of the radio waves intended to be emitted and possibly received by device 100. For example, to accomplish wave emission at approximately 60 GHz, the area of antenna 106 may be between approximately 0.01 $mm^2$ and a few $mm^2$, i.e. less than 10 $mm^2$. In addition, for such an emission frequency, antenna 106 may be approximately 2.5 mm in length.

Components of device 100 are transferred by the flip-chip technique on the side of the front face of substrate 102 (where the active faces of these components which include electrical contacts are located on the side of the front face of substrate 102), in particular on electrically conductive tracks 104 and/or on metal docking terminals, where at least a proportion of these docking terminals are electrically connected to electrically conductive tracks 104. This transfer, which is accomplished by means of microbeads of fusible material, comprising for example SnAgCu and/or SnAu and/or indium, or by means of micro-inserts, for example comprising nickel, enable the components of device 100 to be rigidly connected to substrate 102, and also enable them to be electrically connected to one another, and/or to other elements of device 100.

These components of device 100 are an integrated circuit 108, for example of the ASIC type, a sensor 110, for example of the MEMS and/or NEMS type, and an electrical power supply 112, produced in this case in the form of a microbattery. Sensor 110 is intended to measure one or more physical parameters (for example a vibration and/or radiation external to device 100). In order to be able to transmit signals by radio waves dependent on the measurements made by sensor 110, sensor 110 is electrically connected to integrated circuit 108 via one or more of electrically conductive tracks 104. The measurements made by sensor 110 are thus transmitted to integrated circuit 108 via these tracks 104. Integrated circuit 108, which is for example a microprocessor of the ASIC type, may, for example, transform these measurements into quantifiable values and deliver at output electrical signals corresponding to these measurements. Integrated circuit 108 is electrically connected to antenna 106 by one or more electrically conductive tracks 104, where the output signals of integrated circuit 108 are transmitted to antenna 106 via this or these tracks 104. The output signals of integrated circuit 108 may be the measurements made by sensor 110, or more generally may depend on the measurement values made (device 100 may emit by radio waves data which is not directly equal to the measurements made by sensor 110 but, for example, data the transmission of which is conditional on a certain measurement value). Antenna 106 then emits radio waves 103 which match the signals sent by integrated circuit 108.

The electrical power of integrated circuit 108 is provided by microbattery 112, these two elements being electrically connected to one another by one or more electrically conductive tracks 104. Such a microbattery 112 forms a compact electrical power supply system, capable of delivering sufficient peak power levels, in particular when information is transmitted by antenna 106, and of providing great autonomy (over several years) for device 100. Such a microbattery includes an all-solid-state architecture having the following properties: a long lifetime, a high number of charge/discharge cycles, little self-discharge, high energy efficiency, and low volume. Due to its all-solid-state architecture, and the materials used (for example comprising an inorganic solid electrolyte), use of such a microbattery 112 in device 100, which is intended to operate autonomously for a long operational period, is particularly advantageous. Such a microbattery is described, for example, in the document "*Microbatteries: microsources d'energie en couches minces*" [Micro-batteries: microsources of energy in thin layers], by Levasseur A., Pecquenard B., Vinatier P., Salot R., Le Cras F. and Martin M., *Techniques de l'Ingénieur. Energie* 2009, n° D3342.

Although use of microbattery 112 in device 100 is particularly advantageous, the function of supplying the electrical power of the components of device 100 may be performed by any electrical power source of the accumulator type, providing an autonomous electrical power supply of the elements of device 100.

In device 100 described in connection with FIG. 1, all the components of device 100 are encapsulated in a cavity 114 formed between substrate 102 and a cap 116. Cap 116 comprises in this case silicon which is electrically conductive due to a high doping, and in which cavity 114 has previously been etched. Cap 116 may comprise any electrically conductive material, for example a metal or a metal alloy. However, for reasons of thermal expansion, cap 116 and substrate 102 are advantageously produced from materials having close or similar thermal expansion coefficients, for example silicon. Cap 116 is rigidly connected to substrate 102 via a sealing bead 118, of which at least one portion is, for example, made from the metal layers used to produce electrically conductive tracks 104, and also antenna 106, produced around elements 106, 108, 110 and 112 of device 100. The pattern of the metal layer or layers deposited on substrate 102 and etched therefore includes, in addition to conductive tracks 104 and antenna 106, sealing bead 118. The thickness (dimension in the Z axis) of cap 116 is, for example, between approximately 50 μm and 500 μm. The length (dimension in the X axis) of cap 116, which may be equal to the total length of device 100, and/or the width (dimension in the Y axis) of cap 116, which may also be equal to the total width of device 100, are for example between approximately 0.5 mm and 20 mm. In the example of FIG. 1, the length and the width of cap 116 are roughly similar to those of substrate 102, and are equal to the total length and width of device 100.

The material or materials of sealing bead 118 are chosen such that they enable a mechanical connection to be provided between substrate 102 and cap 116, and an electrical connection with cap 116. Sealing bead 118 comprises, for example, titanium and/or chromium, and/or tungsten nitride and/or nickel and/or gold, and/or an alloy of gold and tin and/or an alloy of gold and silicon. Sealing bead 118 is, for example, between approximately 100 nm and 5 μm thick, and between approximately 10 μm and 1 mm in width.

In addition to the function of mechanical protection of the components performed by cap 116, the fact that cap 116 comprises an electrically conductive material also enables it to perform the function of reflector with regard to the radio waves emitted by antenna 106. The radio waves emitted from antenna 106 in cavity 114 are thus reflected by cap 116, and these reflected waves are emitted outside, then traversing substrate 102. In order for cap 116 to be able to perform this reflector function, it is electrically connected to an electrical potential of reference. In device 100 this reference potential is one of the electrical potentials of microbattery 112. To produce this connection, microbattery 112 is electrically connected to one of conductive tracks 104, which is itself electrically connected to sealing bead 118. Due to the fact that sealing bead 118 and cap 116 are both electrically conductive and in contact with one another, cap 116 is therefore electrically connected to one of the electrical potentials of microbattery 112. As a variant, the electrical potential of reference to which cap 116 is electrically connected may be an electrical potential of integrated circuit 108. In this case, integrated circuit 108 is electrically connected to one of conductive tracks 104, which is itself electrically connected to sealing bead 118.

In order for cap 116 to be able to perform its function as a reflector, cavity 114 in which antenna 106 is positioned is dimensioned such that a space (in which the waves can be propagated) is present between antenna 106 and the wall of cavity 114 opposite antenna 106 (where this wall is formed by cap 116). The height of this space between cap 116 and antenna 106 depends in particular on the permittivity of the element, or material, between antenna 106 and cap 116. When air separates antenna 106 from cap 116, as is the case in the example of FIG. 1, this height is equal to a multiple of λ, and advantageously λ/4, where λ is equal to the wavelength of the waves intended to be emitted. To reduce this distance, a dielectric having a permittivity higher than that of air may be deposited on antenna 106 or against cap 116, inside cavity 114. In the case of a device 100 able to emit waves of frequency equal to approximately 60 GHz, this distance between antenna 106 and the wall of cavity 114 formed by cap 116 opposite antenna 106 is, for example, between approximately 200 μm and 1500 μm.

Cap 116 is made, for example, from a second substrate, comprising for example a semiconductor such as highly doped silicon. Deposition (for example by electrolytic means, by plasma deposition or by evaporation), and structuring of one or more metal layers intended to form at least one portion of sealing bead 118, are firstly accomplished on a face of the second substrate intended to be on the side of substrate 102. A thermal treatment may then be applied in order to diffuse metal species (derived from the deposited metal layers) in the material of the second substrate, and by this means to improve the electrical contact between the deposited metal material or materials and the second substrate. Cavity 114 is then formed in the second substrate, for example by chemical etching from a solution of KOH and/or of TMAH, or by plasma etching of the DRIE type (Deep Reactive Ion Etching), thus completing the production of cap 116. Etching of the DRIE type has the advantage in particular that it forms cavity 114 such that it has very straight side walls. Depending on the etching depth required, i.e. the height of cavity 114, the second substrate may be etched through a photosensitive resin mask and/or an oxide mask.

Cap 116 is then rigidly connected to substrate 102, preferably at the wafer scale, in order to encapsulate components of several devices similar to device 100 simultaneously. This rigid connection may, however, be accomplished at the scale of the chip (corresponding to device 100 on its own). The rigid connection is accomplished, for example, by melting and/or thermocompression, the parameters of which (temperature, pressure, etc.) are dependent in particular on the nature of the materials forming sealing bead 118. In the example described above, thermocompression is therefore applied between the metal materials present on cap 116 and the metal materials present on substrate 102, where these materials have been etched with the desired pattern of sealing bead 118.

When device 100 is produced it may in certain cases be advantageous to separate the manufacture of electrically conductive tracks 104 from the manufacture of antenna 106 and/or from that of sealing bead 118, in order to use different materials and/or different material thicknesses for these different elements. Similarly, metal docking terminals for the microbeads of fusible material used to rigidly connect microbattery 112, integrated circuit 108 and sensor 110 may be produced independently of these elements. It is also possible to apply a thinning and a polishing of the rear face of substrate 102 if it is desired to reduce the initial thickness of substrate 102.

As a variant, it is possible for a portion only of substrate 102 opposite antenna 106 to comprise one or more materials able to be traversed by the radio waves. In this case, this portion of substrate 102 forms a window through which the radio waves can be emitted.

Previously described device 100 is a microelectronic wireless emitter device able to measure a parameter via sensor 110, and to transmit this measurement by radio waves. As a variant, such a microelectronic wireless emitter device may not include this measurement function, and may be used only to transmit (emission and possibly reception)

data by radio waves. A second embodiment of a microelectronic wireless transmitter device 200 is represented in FIGS. 2A and 2B, which are respectively profile and top section views of device 200.

Unlike device 100, device 200 has no elements or components enabling the device to make a measurement. Device 200 thus includes substrate 102, on which are positioned antenna 106, integrated circuit 108 and the electrical power supply formed by microbattery 112. These elements are encapsulated in cavity 114 formed between electrically conductive cap 116 and substrate 102, which are rigidly connected to one another by sealing bead 118. As in device 100, microbattery 112 is electrically connected to integrated circuit 108, in order to power electrically integrated circuit 108. Integrated circuit 108 is also connected electrically to antenna 106 in order to transmit the data to be emitted by radio waves.

In addition, unlike device 100, in which the components (electrical power supply 112, sensor 110 and integrated circuit 108) are connected mechanically to substrate 102 and electrically to conductive tracks 104 by metal microbeads (transfer by flip-chip), the components of device 200 are rigidly connected, for example by bonding, directly to substrate 102, and not on metal portions present on the substrate via microbeads of fusible material. In device 200 it is the rear faces of integrated circuit 108 and of electrical power supply 112, i.e. those which do not have the electrical means of access to these components, which are rigidly connected to substrate 102. At least a proportion of the electrical connections between power supply 112 and integrated circuit 108, between integrated circuit 108 and antenna 106, and between one of the electrical potentials of power supply 112 and sealing bead 118 are made not by electrically conductive tracks, but by electric wires 202 wired between these elements.

FIG. 3 represents a microelectronic wireless emitter device 300 according to a third embodiment.

Device 300 includes all the elements of previously described device 100, i.e. substrate 102, conductive tracks 104, antenna 106, integrated circuit 108, sensor 110, electrical power supply 112, cavity 114, cap 116 and sealing bead 118. However, unlike device 100, electrical power supply 112, which is for example a microbattery, is positioned on substrate 102 outside cavity 114. Only sensor 110, antenna 106 and integrated circuit 108 are protected by conductive cap 116 and positioned in cavity 114.

As with device 100, cap 116 is electrically connected to one of the electrical potentials of power supply 112, via sealing bead 118. Thus, in the example of FIG. 3, an electrically conductive track 302 electrically connects one of the electrical potentials of power supply 112 to sealing bead 118, where this conductive track 302 is positioned outside cavity 114. This electrically conductive track is made, for example, of the same metal layer or layers used to produce the other conductive tracks 114 and/or antenna 106 and/or sealing bead 118. At least one of conductive tracks 104 also connects electrical power supply 112 to integrated circuit 108, in order to power electrically integrated circuit 108. This or these electrical tracks extend from outside cavity 114 as far as the interior of cavity 114, and are electrically insulated from sealing bead 118, for example by inserting an electrically insulating material between these tracks 104 and sealing bead 118, as will be described below in connection with FIGS. 4A and 4B.

As a variant, device 300 may not include sensor 110, as in device 200. In this case, only antenna 106 and integrated circuit 108 are protected by conductive cap 116, and positioned in cavity 114. In addition, at least a proportion of the different electrical connections between the components of device 300 may be made by electrical wires 202, as in device 200.

FIGS. 4A and 4B represent a device 400 according to a fourth embodiment. As represented in these figures, the electrical connection between electrical power supply 112 and integrated circuit 108 is made by two electric wires 402, connected to two electrically conductive tracks 404, extending on substrate 102 between the inside and outside of cavity 114, and which are electrically insulated from sealing bead 118, due to a layer of dielectric material 407 completely covering tracks 404 and positioned between tracks 404 and sealing bead 118. This layer of dielectric material 407 is advantageously planarised such that sealing bead 118 is not discontinuous. An electric wire 402 also connects one of the electrical potentials of power supply 112 to sealing bead 118. Electric wires 406 also make the electrical connections between antenna 106 and integrated circuit 108, between integrated circuit 108 and conductive tracks 404, and between integrated circuit 108 and sensor 110.

In this fourth embodiment, electrical power supply 112 is coupled to an energy recovery device 408, based for example on an energy conversion technique which may be photovoltaic and/or mechanical (for example by the vibrations to which the device is subject) and/or thermal (for example, by a temperature gradient on the device using the Seebeck effect).

FIGS. 5A and 5B represent a device 500 according to a fifth embodiment. Device 500 includes a first cavity 114, formed between substrate 102 and cap 116, in which are encapsulated electrical power supply 112 and integrated circuit 108 (which, in this embodiment, also performs the role of sensor 110), and a second cavity 514, in which antenna 106 is encapsulated. A portion of cap 116 forms a separation 502 between the two cavities 114, 514, and enables any electromagnetic disturbance of components 112, 108 towards antenna 106 to be prevented. This separation 502 is advantageously produced by a portion of cap 116, since the latter is electrically conductive. Separation 502 between the two cavities 114, 514 is not necessarily in contact with substrate 102. In this case, it is not necessary to protect, and in particular to insulate electrically, conductive tracks 104 connecting integrated circuit 108 and antenna 106, since separation 502 does not come into contact with these tracks 104. As a variant, separation 502 could be produced from a portion of material not belonging to cap 116, i.e. which is transferred on to cap 116 to form an electromagnetic screen between the two cavities 114, 514. Finally, in device 500, cap 116 is electrically connected, via sealing bead 118, to an electrical potential of integrated circuit 108.

In all the previously described embodiments and variants, it is possible for cavity 114 not to be formed in cap 116, but in substrate 102 (where the cap is in this case an electrically conductive flat substrate), or partly in substrate 102 and partly in cap 116, or again it is possible that at least a proportion of the side walls of cavity 114 are formed by portions of electrically conductive material independent of substrate 102 and of cap 116, and electrically connected, like cap 116, to an electrical potential of power supply 112.

The invention claimed is:

1. A microelectronic wireless transmission device including at least:
   a substrate able to be traversed by radio waves intended to be emitted by the microelectronic device,
   an antenna, an electrical power supply, an integrated circuit, electrically connected to the antenna and to the electrical power supply, and able to transmit to the antenna electrical signals intended to be emitted by the antenna in the form of the said radio waves, and a cap rigidly connected to the substrate and forming, with the substrate, at least one cavity in which the antenna and the integrated circuit are positioned, where the cap is exposed to the cavity on one side and comprises an electrically conductive material connected electrically by a conducting element to an electrical potential of the electrical power supply and of the integrated circuit such that the electrical potential of the electrical power supply and of the integrated circuit is applied on the electrically conductive material of the cap, and configured to form a reflector with regard to the radio waves intended to be emitted by the antenna.

2. The device according to claim 1, in which the integrated circuit and the antenna are positioned in two separated cavities formed between the cap and the substrate.

3. The device according to claim 1, in which the electrical power supply includes at least one microbattery and/or is positioned in the cavity or one of the cavities.

4. The device according to claim 1, in which the electrical connections between the integrated circuit and the antenna, between the integrated circuit and electrical power supply, and between the cap and the electrical power supply, include wires and/or electrically conductive tracks positioned on the substrate.

5. The device according to claim 4, in which the electrically conductive tracks comprise at least one electrically conductive material similar to the at least one electrically conductive material of the antenna.

6. The device according to claim 1, in which the side walls of the cavity are formed by the cap.

7. The device according to claim 1, in which the cap is rigidly connected to the substrate by at least one sealing bead comprising at least one electrically conductive material.

8. The device according to claim 7, in which the electrical power supply and the integrated circuit is electrically connected to the sealing bead which is in contact with the cap.

9. The device according to claim 7, in which the sealing bead comprises at least one metal material similar to at least one metal material of the antenna.

10. The device according to claim 1, also including at least one sensor positioned in the cavity or one of the cavities and electrically connected to the integrated circuit such that the sensor is able to transmit at least one measuring signal to the integrated circuit, where at least a proportion of the electrical signals transmitted by the integrated circuit to the antenna is dependent on the measuring signal transmitted to the integrated circuit by the sensor.

11. The device according to claim 1, also including at least one energy recovery device electrically coupled to the electrical power supply.

12. The device according to claim 1, wherein a height of a space between the cap and the antenna in the at least one cavity is equal to a multiple of $\lambda$, where $\lambda$ is a wavelength of waves emitted by the antenna.

13. The device according to claim 1, wherein the cap is exposed to air on a second side opposite to said one side.

14. A method for producing a microelectronic wireless transmission device, including at least the following steps:

integration, on a substrate able to be traversed by radio waves intended to be emitted by the microelectronic device, of an antenna, an electrical power supply and an integrated circuit electrically connected to the antenna and to the electrical power supply, and able to transmit to the antenna electrical signals intended to be emitted by the antenna in the form of the said radio waves, and rigid connection of a cap to the substrate, forming at least one cavity in which the antenna and the integrated circuit are positioned, where the cap is exposed to the cavity on one side and comprises an electrically conductive material connected electrically by a conducting element to an electrical potential of the electrical power supply and of the integrated circuit such that the electrical potential of the electrical power supply and of the integrated circuit is applied on the electrically conductive material of the cap, and configured to form a reflector with regard to the radio waves intended to be emitted by the antenna.

15. The method according to claim 14, including at least, before the electrical power supply and the integrated circuit are integrated, steps of deposition, photolithography and etching of at least one electrically conductive layer on the substrate, forming the antenna and electrically conductive tracks, where the integrated circuit and the electrical power supply are connected to at least one portion of the electrically conductive tracks by microbeads or wired connections, where the electrically conductive tracks form at least a proportion of the electrical connections between the integrated circuit and the antenna, between the integrated circuit and the electrical power supply, and between the cap and the electrical power supply and/or the integrated circuit.

16. The method according to claim 15, in which the steps of deposition, photolithography and etching of the said at least one electrically conductive layer on the substrate also form at least a portion of a sealing bead, where the cap is rigidly connected to the substrate by the sealing bead.

17. The method according to claim 14, also including incorporation of a sensor such that it is positioned in the cavity and electrically connected to the integrated circuit, where the sensor is able to transmit at least one measuring signal to the integrated circuit, and where at least a proportion of the electrical signals transmitted by the integrated circuit to the antenna is dependent on the measuring signal transmitted to the integrated circuit by the sensor.

18. The method according to claim 14, also including at least the incorporation of an energy recovery device electrically coupled to the electrical power supply.

* * * * *